United States Patent [19]

Zehren

[11] 4,305,436
[45] Dec. 15, 1981

[54] WIRE TENSIONING APPARATUS

[75] Inventor: James N. Zehren, Bartlesville, Okla.

[73] Assignee: TRW Inc., Cleveland, Ohio

[21] Appl. No.: 84,757

[22] Filed: Oct. 15, 1979

Related U.S. Application Data

[60] Division of Ser. No. 816,493, Jul. 18, 1977, Pat. No. 4,198,173, which is a continuation of Ser. No. 616,318, Sep. 24, 1975, abandoned.

[51] Int. Cl.$^3$ ............................................. B25B 25/00
[52] U.S. Cl. ................................................. 140/123.5
[58] Field of Search ...................... 140/123.5; 254/238, 254/239, 240

[56] References Cited

U.S. PATENT DOCUMENTS

| | | | |
|---|---|---|---|
| 341,251 | 5/1886 | Baure | 140/123.5 |
| 547,021 | 10/1895 | Murchison | 140/123.5 |
| 886,920 | 5/1908 | Atkinson | 254/238 |
| 1,152,507 | 9/1915 | Hiatt | 254/240 X |
| 1,400,093 | 12/1921 | O'Connor et al. | 254/238 |

Primary Examiner—Gil Weidenfeld
Assistant Examiner—K. J. Ramsey
Attorney, Agent, or Firm—Shapiro and Shapiro

[57] ABSTRACT

Apparatus for tensioning wire, such as wire loops applied over a braided wire sleeve forming a sheath for an electrical cable splice. The tensioning apparatus comprises an jack rod and jacking mechanism of known construction, a first wire clamp fixed to the based end of the jack rod, and a second wire clamp assembly slidably mounted on the jack rod opposite the jacking mechanism from the first wire clamp whereby the jacking mechanism may be operated to spread the lapped ends of a wire loop to tighten the loop.

2 Claims, 11 Drawing Figures

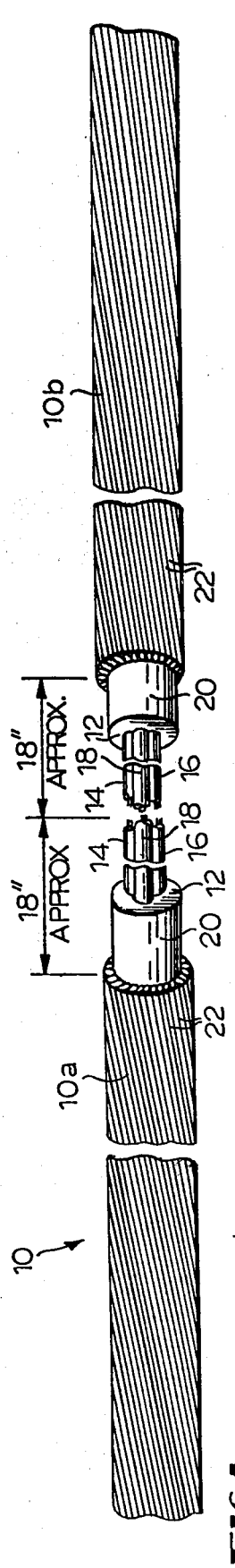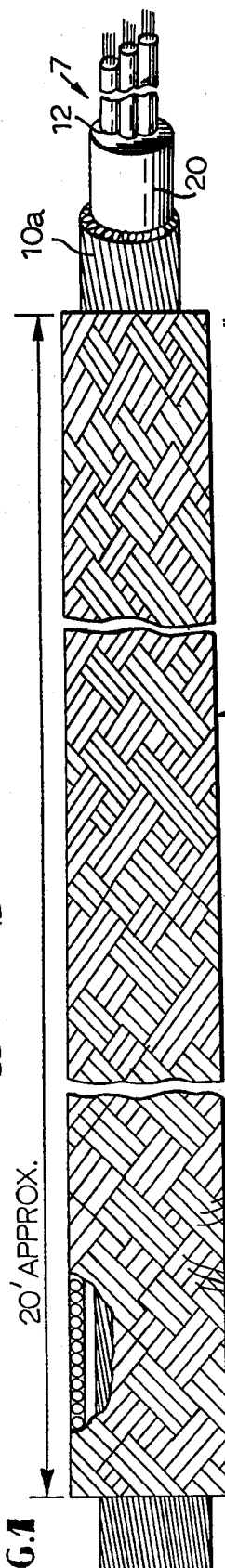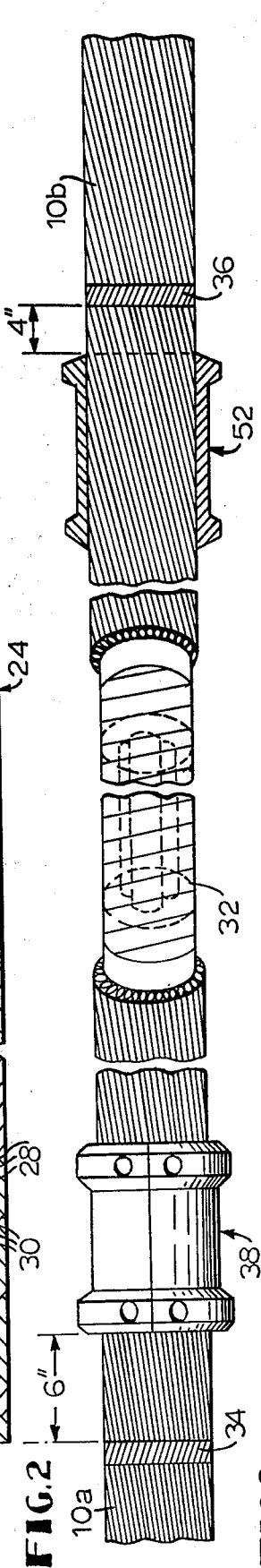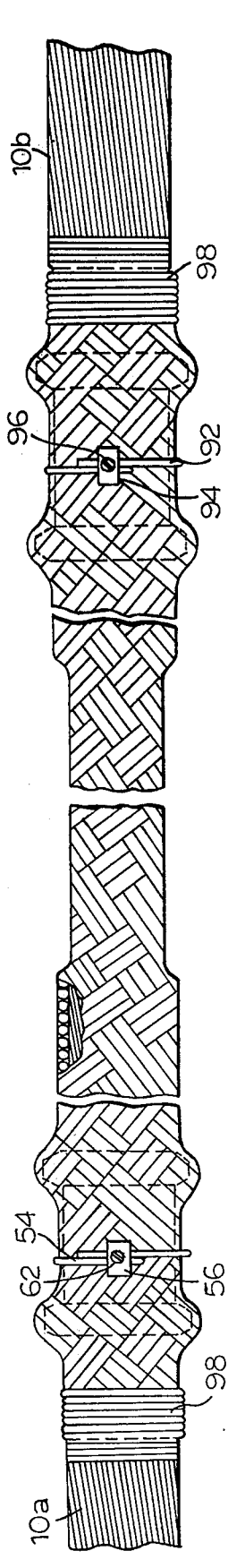

WIRE TENSIONING APPARATUS

This is a divisional application of Ser. No. 816,493, filed July 18, 1977, now U.S. Pat. No. 4,198,173 which application is a continuation of copending application Ser. No. 616,318, filed Sept. 24, 1975 now abandoned.

BACKGROUND OF THE INVENTION

This invention relates to splices for mechanically coupling sections of cable or other elongated sections, and is more particularly concerned with self-tightening mechanical splices for use in conjunction with electrical splices in armored electrical cable.

In the pumping of oil and other liquids from deep wells, it is common practice to employ submergible pumping units which are suspended in the wells by armored electrical cables, the pumping units containing pumps of the centrifugal type, for example, and electric driving motors. The cables typically comprise a plurality of insulated electrical conductors for supplying power to the electric motor and a multiplicity of outer armor wires for supporting the weight of the pumping unit.

Because the occurrence of an electrical fault in such cable requires that the pumping unit be taken out of service until the fault can be repaired, it is desirable that the electrical fault be quickly and simply repaired at the site. Although the electrical fault can be repaired by cutting out the affected portion of the cable and splicing together the corresponding conductors of the cable sections in a known manner, the prior art does not provide simple, economical, and easily-installed apparatus for flexibly, mechanically coupling together the armor wires of the cable sections so that tension will not be applied to the electrical splice proper when the spliced cable is returned to service.

SUMMARY OF THE INVENTION

It is accordingly an object of the present invention to provide an improved apparatus and method for forming a mechanical splice between sections of cable or other elongated sections and, more particularly, to provide a strong, flexible, self-tightening mechanical splice which is simple, economical and easily installed in the field.

Another object of the invention is to provide a mechanical splice which may be employed in conjunction with an electrical splice in an electrical cable to prevent the application of tension to the electrical splice proper when tension is applied to the spliced cable.

Another object of the invention is to provide improved apparatus for forming wire clamps in mechanical splices.

Still another object of the invention is to provide an improved grommet for use in mechanical splices.

Briefly stated by way of example, a mechanical splice in accordance with the present invention for coupling sections of cable comprises an elongated coupling sleeve receiving opposed end portions of the cable sections, the opposite ends of the sleeve being attached to the cable sections by being secured to grommets mounted on the cable sections. The preferred coupling sleeve is transversely constrictive, preferably comprising a braided wire sleeve. Each grommet may comprise a pair of semi-cylindrical half sections having threaded longitudinal recesses which cooperate to form an axially aligned, threaded cylindrical bore for receiving the associated cable section, the bore having a diameter smaller than the outside diameter of the cable section for enabling the grommet to grip the cable section tightly when the grommet half sections are clamped around the cable section. The cylindrical surfaces of the grommet sections have groove portions which cooperate to form a central circumferential groove on each grommet for receiving the wire clamps. For forming the wire clamps, an automobile jack of known construction may be modified to provide a tool for applying tension to lengths of wire which are looped about the ends of the sleeve.

The mechanical splice of the invention may be employed in conjunction with an electrical splice in electrical cable, such as armored electrical cable, to prevent the application of tension to the electrical splice proper. For this purpose, the cable sections joined by the electrical splice are pushed together inside the braided wire sleeve before the ends of the sleeve are secured thereto so that slack is introduced in the cable in the region of the electrical splice.

BRIEF DESCRIPTION OF THE DRAWINGS

The invention will be further described in conjunction with the accompanying drawings which illustrate a preferred and exemplary embodiment, and wherein:

FIGS. 1-4 are truncated, perspective views illustrating a method and apparatus for forming a mechanical splice in accordance with the invention, with FIG. 4 showing the completed mechanical splice as it appears when tension is applied to the spliced cable;

DESCRIPTION OF THE PREFERRED EMBODIMENT

Figure 9:
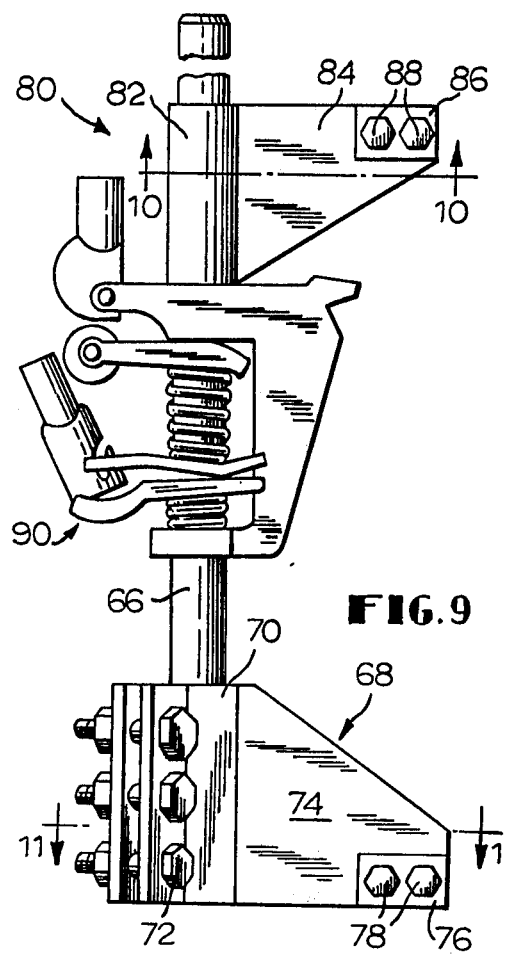
FIG. 9 is a plan view of a tool for forming wire clamps which are employed in the mechanical splice.
Figure 10:
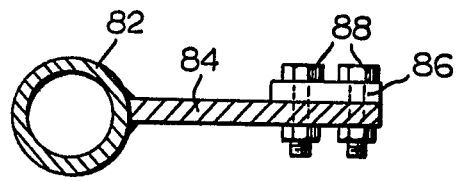
FIG. 10 is a vertical cross-sectional view taken in the plane of line 10—10 of FIG. 9.
Figure 11:
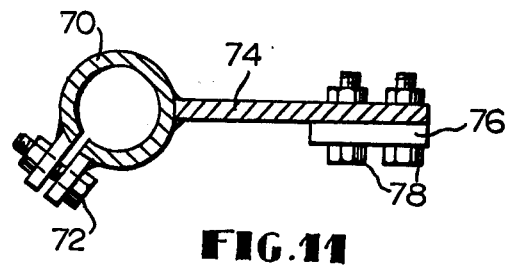
FIG. 11 is a vertical cross-sectional view taken in the plane of line 11—11 of FIG. 9.

Referring to the drawings, FIGS. 1-4 illustrate a method and apparatus in accordance with the invention for forming a self-tightening, flexible mechanical splice between a pair of elongated sections of cable or the like. For the purpose of illustration, the mechanical splice of the invention, as described below, is employed in conjunction with an electrical splice in an electrical cable for preventing application of tension to the electrical splice proper when tension is applied to the spliced cable.

The electrical cable may comprise armored electrical cable of the type disclosed in U.S. Pat. No. 3,424,485 to Arutunoff, for example, for supplying electrical power to and for supporting a submergible pumping unit (not shown) of the type utilized to pump oil or other liquids from deep wells. The pumping unit may include a submergible centrifugal pump (see, for example, U.S. Pats. No. 2,236,887; No.2,270,666; and No. 2,775,945) and a submergible electric motor for driving the pump (see, for example, U.S. Pats. No. 2,001,649; No. 2,251,816; No. 2,315,917; and No. 3,433,936). As shown in FIG. 1, the electrical cable 10 may comprise a flexible insulating core 12 in which are provided a number of insulated conductors, such as conductors 14, 16 and 18, for supplying power to the submergible electric motor. The core is enclosed in a flexible protective jacket 20 of oil-resistant or waterproof material, such as rubber. Helically wound about the jacket is a multiplicity of weight-supporting armor wires 22 for suspending the submergible pumping unit in operating position in a well.

In accordance with the invention, when an electrical fault (such as a short to ground of one of the electrical conductors) is detected, the cable and depending pumping unit are pulled from the well to expose the location of the electrical fault (which may appear as a burnt spot on the cable). A cutting wheel (not shown), which may be mounted in a hand-held electric drill, is then used to cut through slightly less than the entire thickness of the armor wires 22 at points approximately eighteen inches on either side of the fault. The armor wires, being brittle, are then broken off at the cuts and removed. This ensures that protective jacket 20 will not be damaged by the cutting wheel.

Next, the remainder of the cable is cut through at the fault and an elongated, flexible coupling sleeve or finger-stall 24 (see FIG. 2) is slipped onto one of the cable sections, such as section 10a, and positioned well away from the cut end of that cable section. The finger-stall, which may be of the order of twenty feet in length, comprises a plurality of elongated elements, such as wires 28 and 30, which are interwoven in groups of three wires over its entire length to provide a braided sleeve, each group of wires 28 passing alternately over and under the groups of wires 30, and vice versa. When the finger-stall is in relaxed condition, that is, when no longitudinal tensile stress is applied thereto, it has an inside diameter which is slightly larger than the diameter of the cable for enabling the sleeve to be easily slipped onto the cable section. However, by virtue of its braided construction, application of tension to the finger-stall causes it to elongate slightly and to constrict transversely, like a Chinese finger clamp. Thus, as will be apparent hereinafter, when the opposed end portions of cable sections to be mechanically spliced are received by the finger-stall and the opposite ends of the finger-stall are attached thereto, a self-lightening, flexible, mechanical splice is formed between the cable sections.

After the finger-stall has been slipped onto cable section 10a, the protective jacket 20 and the core 12 are cut away to expose the conductors 14, 16 and 18 in the region of the fault. The bad portions of the conductors are removed and the ends of corresponding conductors in cable sections 10a and 10b are then electrically spliced together in a known manner. After the electrical splice is formed, the portion of the core which was cut away to expose the conductors is then filled in by suitable insulating materials, such as by wrapping the exposed conductors with insulating electrical tape 32 until the diameter of the filled-in portion is approximately equal to the diameter of core 12.

Next, the finger-stall is positioned centrally over the electrical splice so that the ends of the finger-stall are approximately equal distances from the electrical splice, and electrical tape is wrapped about cable sections 10a and 10b to mark the positions of the ends of the finger-stall. The finger-stall is then slipped back over one section and moved well away from the portions of the cable sections which lie between those tape markings, which are formed at 34 and 36, respectively, as shown in FIG. 3.

Figure 5:
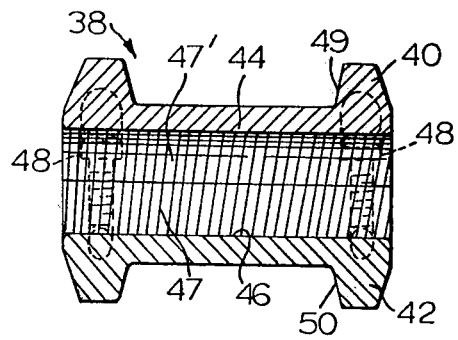
FIG. 5 is a longitudinal cross-sectional view of a grommet employed in the mechanical splice.
Figure 6:
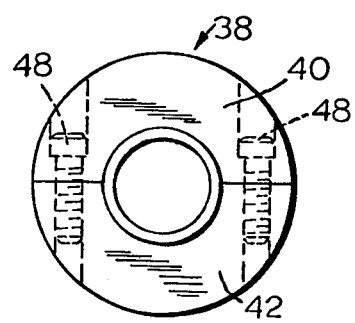
FIG. 6 is an end view of the grommet.

Referring to FIG. 3, a two-piece cylindrical grommet 38 is then mounted on cable section 10a in a position near the tape 34 on the side of the tape nearest the electrical splice. The distance between the tape and the end of the grommet may be about six inches, for example. As shown in FIGS. 5 and 6, the grommet comprises a pair of semi-cylindrical half sections 40 and 42 having semi-cylindrical longitudinal recesses 44 and 46 therein, respectively, which cooperate when the half sections are joined for forming an axially disposed cylindrical opening or bore for receiving the cable section. The bore has a diameter which is slightly smaller than the outside diameter of the cable (for example, by 50 to 60 mils), and the recesses 44 and 46 are provided with rough threads 47 and 47', respectively, so that the threaded bore of the grommet securely grips the armor wires when the half sections are brought together around the cable section by tightening screws 48 in associated transverse threaded bores. Groove portions 49 and 50 in the cylindrical surfaces of half sections 40 and 42, respectively, form an external central circumferential groove on the grommet.

A second grommet 52 (FIG. 3), identical in construction to grommet 38, is secured to cable section 10b in a position near tape 36 on the side of the tape nearest the electrical splice. For reasons which will become apparent hereinafter, the distance between the end of this grommet and tape 36 is selected to be slightly less than the distance between grommet 38 and tape 34, and may be about four inches, for example.

Figure 7:
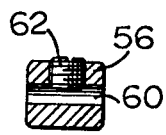
FIG. 7 is a longitudinal cross-sectional view of a fastener employed in the mechanical splice.
Figure 8:
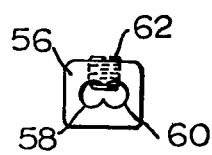
FIG. 8 is an end view of the fastener.

The finger-stall 24 is then slipped over the grommets and positioned centrally over the electrical splice with the ends of the finger-stall in alignment with marking tape 34 and 36 so that the end portions of cable sections 10a and 10b which are received by the finger-stall are approximately equal in length. The left end portion of the braided finger-stall is then secured to grommet 38 by a wire clamp. To form the wire clamp, a length of wire is wrapped once around the finger-stall to provide a wire loop 54, the ends of the wire being inserted through respective openings 58 and 60 in a buckle or fastening block 56 (see FIGS. 7 and 8). For reasons which will be apparent hereinafter, the wire is of such length that both end portions of the wire extend a considerable distance from the fastening block, terminating about one foot from the fastening block, for example. The wire loop is positioned in alignment with the circumferential groove on the grommet 38, and tension is applied to the ends of the length of wire for drawing wire loop 54 tightly about the finger-stall in the groove on the grommet. When the wire loop is sufficiently tight, the ends of the wire are secured in the fastening block by tightening set screw 62.

Referring to FIG. 9, a tool for tightening the wire loop to form the wire clamp may be provided by simple modification of an automobile jack assembly of known construction. Mounted at one end of the jack post or rod 66 is a fixed wire clamping assembly 68 comprising a sleeve 70 clamped to the jack post by bolts 72 and having a generally triangular plate 74 welded thereto. A small rectangular clamping plate 76 is mounted in a corner of plate 74 remote from sleeve 70 by bolts 78. A movable clamping assembly 80 comprises a sleeve 82 adapted to slide on the jack post and having welded thereto a generally triangular plate 84. A small rectangular clamping plate 86 is mounted by bolts 88 in a corner of plate 84 remote from sleeve 82. Carried by the jack post intermediate the two clamping assemblies is the lifting mechanism 90 of a conventional jack. This mechanism may be actuated in a known manner by a bar or tire iron (not shown) to move the clamping assembly 80 longitudinally along the jack post away from clamping assembly 68, and includes a release mechanism for enabling the lifting mechanism to be moved toward clamping assembly 68.

In operation of the tool of FIG. 9, the lifting mechanism 90 is initially positioned near the fixed clamping assembly 68. One end of the length of wire forming the wire loop 54 and extending from the fastening block 56 is gripped between plates 74 and 76 of clamping assembly 68 by tightening bolts 78. The other end of the wire is inserted between plates 84 and 86 of clamping assembly 80 and is pulled hand-tight before it is gripped between those plates by tightening bolts 88. The lifting mechanism 90 is then actuated to apply tension to the wire for causing the wire loop 54 to be drawn tightly about the sleeve in the circumferential groove of grommet 38. When the degree of tightness for sufficient clamping has been attained, set screw 62 in the fastening block is tightened against the parts of the wire in the channels 58 and 60 of the fastening block. The release mechanism of the jack is then activated to relax the tension on the length of wire and the ends of the wire are cut off near the fastening block, as shown in FIG. 4.

Before the opposite end portion of the braided finger-stall is secured to its associated grommet 52 by a similar wire clamp, cable section 10b is pushed into the finger-stall toward cable section 10a a short distance, such as two inches, for introducing slack in the end portions of the cable sections which are received by the finger-stall. The distance between the right end of the finger-stall and the grommet 52 is then approximately six inches, which is the distance between the end of grommet 38 and tape 34. The right end of the finger-stall is then clamped to the grommet 52 by another wire clamp which is constructed in the manner described previously, the clamp comprising a single loop of wire 92 having its ends secured in a fastening block 94 by a set screw 96. Mousing wire 98 may then be wrapped about the ends of the finger-stall for neatness, as shown in FIG. 4.

When the spliced cable and depending pumping unit are returned to operating position in the well, the tension applied to the finger-stall as a result of the weight of the pumping unit causes the braided finger-stall to elongate slightly and to constrict transversely so that the finger-stall self-tightens about the cable sections to firmly grip the armor wires, as shown in FIG. 4. The amount of elongation of the finger-stall is somewhat less than the amount of slack previously introduced into the end portions of the cable sections so that no tension is applied to the electrical splice proper, the tension being carried by the finger-stall in the region of the electrical splice.

Although the mechanical splice of the invention has been described with reference to armored electrical cable, it will be apparent that the apparatus and method of the invention may be employed to provide strong, flexible mechanical splices between elongated sections of other materials.

While a preferred embodiment of the invention has been shown and described, it will be apparent to those skilled in the art that changes can be made in this embodiment without departing from the principles and spirit of the invention, the scope of which is defined in the appended claims.

The invention claimed is:

1. Wire tensioning apparatus in the form of a jack assembly including a jack rod, a jacking mechanism carried on said rod, a first wire clamping means fixed to said rod on one side of said jacking mechanism and a second wire clamping means slideably mounted on said rod on the other side of said jacking mechanism whereby a wire gripped by the clamping means may be tensioned by providing jacking movement of the jacking mechanism along the rod effective to move the second clamping means away from the first clamping means.

2. Apparatus as defined in claim 1 wherein said jack assembly is a modified automobile jack.

* * * * *